United States Patent

Yamakoshi et al.

Patent Number: 5,952,831
Date of Patent: Sep. 14, 1999

[54] AUTOMATIC SAMPLE EXCHANGE DEVICE

[75] Inventors: Yoshiaki Yamakoshi; Nobuo Kudo, both of Tokyo, Japan

[73] Assignee: JEOL Ltd., Tokyo, Japan

[21] Appl. No.: 08/911,339

[22] Filed: Aug. 14, 1997

[51] Int. Cl.$^6$ .................................................. G01V 3/00
[52] U.S. Cl. .................................... 324/321; 324/316
[58] Field of Search .................................. 324/321, 316, 324/318, 322, 312, 306, 300

[56] References Cited

U.S. PATENT DOCUMENTS

| 4,581,583 | 4/1986 | Van Vliet et al. | 324/321 |
| 5,237,276 | 8/1993 | Cory | 324/321 |
| 5,534,780 | 7/1996 | Lilly | 324/321 |

*Primary Examiner*—Louis Arana
*Attorney, Agent, or Firm*—Webb, Ziesenheim, Logsdon, Orkin & Hanson, P.C.

[57] ABSTRACT

A small-sized, inexpensive automatic sample exchange device for use with an NMR spectrometer. The exchange device has a mechanism acting to convey sample tubes and also to grip them. The exchange device includes a disk plate located just above a sample inlet hole formed in the spectrometer. The disk plate has a fringe portion provided with a recess. The sample tubes are inserted into a given number of sleeves, which are mounted to a turntable and to the disk plate. An ultrasonic motor rotates the turntable, the disk plate, and the sleeves integrally. When the sleeves register with the recess in the disk plate, the fringe portion of the disk plate does not protrude into holes formed in the sleeves. When the sleeves do not register with the recess, the fringe portion protrude into the holes in the sleeves, thus gripping the sample tubes.

7 Claims, 7 Drawing Sheets

AUTOMATIC SAMPLE EXCHANGE DEVICE

FIELD OF THE INVENTION

The present invention relates to an analytical instrument for analyzing samples, such as a nuclear magnetic resonance (NMR) spectrometer and, more particularly, to an automatic sample exchange device for exchanging samples investigated by such an analytical instrument.

BACKGROUND OF THE INVENTION

NMR spectrometers analyze the structures of substances by making use of resonance of atomic nuclei within a magnetic field. These NMR spectrometers have been heretofore fitted with automatic sample exchange devices to automatically and successively extract samples and to perform measurements.

Figure 7:
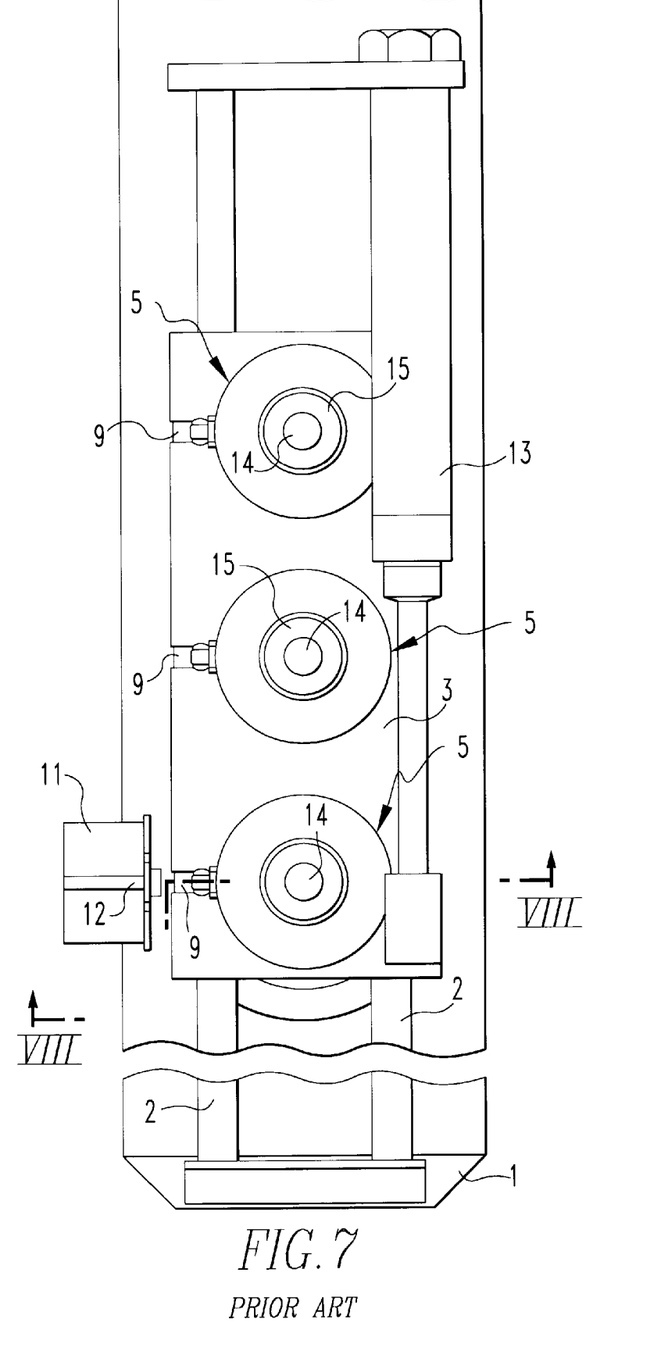
FIG. 7 is a plan view of the prior art automatic sample exchange device.
Figure 8:
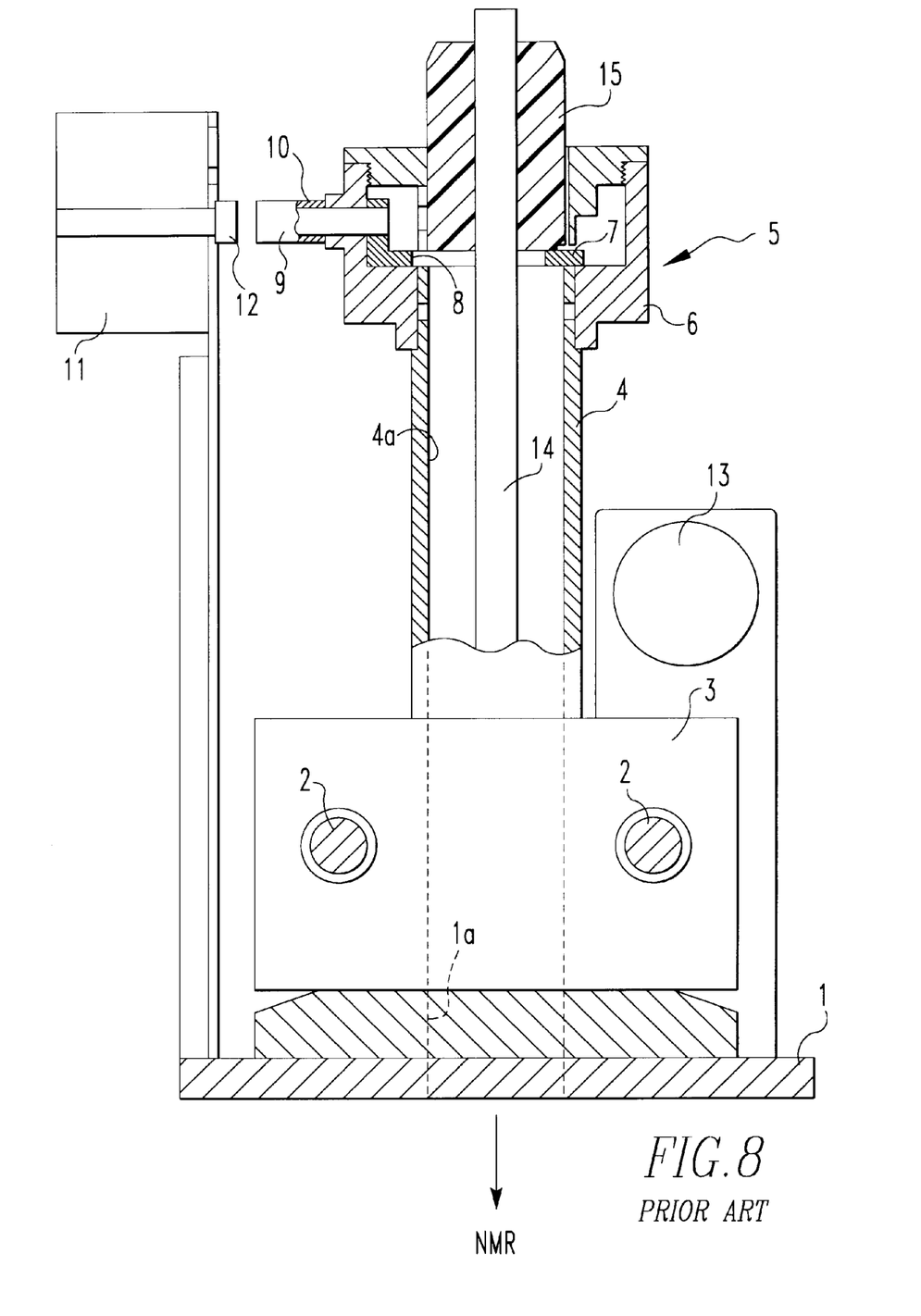
FIG. 8 is a cross-sectional view taken on line VIII—VIII of FIG. 7.

FIG. 7 is a plan view of such a conventional automatic sample exchange device. FIG. 8 is a cross-sectional view taken along line VIII—VIII of FIG. 7. This exchange device comprises a support base 1, a pair of guide rails 2 mounted on the support base 1, a slidable base plate 3 mounted so as to be slidable on the support base 1 while guided by the guide rails 2, a sleeve 4 extending upright from the base plate 3, chucks 5, chuck-holding members 6 mounted on the sleeve 4, slide plates (gates) 7 capable of sliding on the chuck-holding members 6, respectively, rods 9 connected with their respective slide plates 7, springs 10 for constantly biasing the slide plates 7 to the left via the rods 9, a single-action cylinder 11 mounted to the support base 1, an x-motion cylinder 13 for moving the base plate 3 in the x-direction, and a sample rotor 15. Each slide plate 7 is provided with a hole 8 having a diameter equal to the inside diameter of the sleeve 4. The sample rotor 15 has a diameter slightly smaller than that of the hole 8. The single-action cylinder 11 has a shaft 12. Sample tubes 14 are placed in the sample rotor 15.

An x-motion auxiliary cylinder (not shown) is mounted below the x-motion cylinder 13. These x-motion cylinders including the cylinder 13 control and increase the stroke of the base plate 3 in the x-direction. The single-action cylinder 11 and its shaft 12 are designed so that when the hole 4a in the sleeve 4 registers with a sample inlet hole 1a in the body of an NMR spectrometer, the rods 9 of the chucks 5 mounted to the sleeve 4 are placed opposite to the shaft 12.

In the prior art automatic sample exchange device constructed as described above, the rod 9 of each chuck 5 is not pushed by the shaft 12 in normal state. Under this state, the biasing force of the spring 10 urges the slide plate 7 into the leftmost position (gate closed position) as viewed in the figure via the rod 9. At this leftmost position of the slide plate 7, the hole 8 is located in an eccentric relation to the hole 4a in the sleeve 4. Under this condition, if any sample tube 14 holding a sample is inserted into the holes 8 and 4a from the sample inlet hole, the bottom surface of the sample rotor 15 engages the wall defining the hole 8 in the slide plate 7. Therefore, the sample tube 14 is held in the illustrated state by the chuck 5 energized.

After holding the sample tube 14 in this way, the two x-motion cylinders including the cylinder 13 are driven to move the base plate 3 in the x-direction until the hole 4a in the sleeve 4 registers with the sample inlet hole 1a in the support base 1, whereupon the movement of the support base 1 is stopped. At this time, low-pressure air is supplied from the body of the NMR spectrometer through the sample inlet hole. The air flows through the hole 4a in the sleeve 4 and strikes the sample rotor 15.

Then, the single-action cylinder 11 is driven to push the shaft 12 forward. This shaft 12 pushes the rod 9 to the right, so that the slide plate 7 is moved to the right (gate open position). The hole 8 in the slide plate 7 is brought into registry with the hole 4a in the sleeve 4. This disengages the bottom surface of the sample rotor 15 from the wall defining the hole 8 in the slide plate 7. As a result, the sample tube 14 is released from the chuck 5, i.e., the chuck is deenergized. At this time, the rod 9 is kept pushed by the shaft 12. The sample tube 14 is kept afloat by the low-pressure air coming from below even if the chuck is deenergized. The sample tube 14 is moved downward toward the body of the NMR spectrometer by controlling the supply of the low-pressure air.

When the NMR spectrometer finishes a measurement of the sample inside the sample tube 14, air is again supplied to move the sample tube 14 toward the chuck 5. When the bottom surface of the sample rotor 15 passes beyond the slide plate 7, the single-action cylinder 11 is deactivated, thus retracting the shaft 12. The shaft 12 no longer pushes the rod 9, so that the slide plate 7 is at the leftmost position. Under this condition, the hole 8 is again placed in an eccentric relation (gate closed position) to the hole 4a in the sleeve 4. The supply of the air is stopped. The sample tube 14 is kept held by the chuck 5 energized.

In order to introduce the sample tube 14 held by an adjacent chuck 5 into the body of the NMR spectrometer, the two x-motion cylinders including the cylinder 13 are driven to shift the base plate 3 in the x-direction. The hole 4a in the sleeve 4 holding the sample tube 14 is brought into registry with the sample inlet hole 1a. Subsequently, sample tubes 14 are introduced and withdrawn in a manner similar to the foregoing processing. In this way, the sample in the body of the NMR spectrometer is automatically exchanged by the automatic sample exchange device.

In the prior art automatic sample exchange device constructed as described above, the single-action cylinder 11 for moving the slide plate 7 of the chuck is separate from the x-motion cylinder (such as 13) that carries the chuck 5 holding the sample tube 14. Therefore, these two mechanisms must be controlled separately and in an interlocking manner. Hence, complex control unit and control software are necessary.

Also, each individual tube 14 needs a separate chuck 5. Therefore, if the number of the sample tubes 14 is increased, the number of the chucks 5 is increased proportionately. This increases the cost. Furthermore, the instrument is made bulky. Moreover, since each chuck 5 grips the sample tube 14 under normal condition, the chuck is urged to release the tube only at one location. Consequently, the chuck 5 is expanded a great deal, thus requiring relatively large space. However, the space for accommodating the chucks 5 is limited and so it is difficult to increase the number of the used chucks 5 that expand a great deal as described above. Heretofore, the maximum number of used chucks as been three as shown. Accordingly, the number of the sample tubes 14 used is limited to three. It has been difficult to employ more sample tubes. Additionally, the stroke of the x-motion cylinder 13 is limited and, therefore, the base plate 3 can move only a limited distance. This also limits the number of used sample tubes 14.

SUMMARY OF THE INVENTION

In view of the foregoing problems, it is an object of the present invention to provide an inexpensive automatic sample exchange device which is not bulky, can hold more sample tubes than conventional, has a mechanism acting as a sample tube conveyance mechanism and also as a sample tube-gripping mechanism, and thus is easy to control.

This object is achieved in accordance with the teachings of the present invention by an automatic sample exchange device comprising at least a fixed plate and a movable plate. The fixed plate has a fringe portion or edge portion provided with a recess located just above a sample inlet hole. The movable plate can move along the fringe portion of the fixed plate, and has a given number of sleeves. Sample tubes are inserted into the sleeves, respectively. These sleeves can be moved in interrelated directions. The bottom surfaces of the sleeves can be placed in an opposite relation to (registered) the sample inlet hole. When any one of the sleeves of the movable plate registers with the recess in the fixed plate, the fringe portion of the fixed plate does not protrude into the hole in the sleeve. When the sleeve does not register with the recess, the fringe portion of the fixed plate protrudes into the hole in the sleeve, thus holding the sample tube.

In the novel automatic sample exchange device of the construction described above, when the sleeve does not register with the recess, if a sample tube is inserted into the sleeve, the fringe portion of the fixed plate protrudes into the hole in the sleeve, thereby holding the sample tube in the sleeve. That is, the chuck is energized. Under this condition, the movable plate moves along the fringe portion of the fixed plate until the sleeve comes into registry with the recess in the fixed plate, whereupon the fringe portion of the fixed plate is withdrawn from the hole in the sleeve. Under this state, the sample tube in the sleeve is no longer gripped (i.e., the chuck is deenergized). Since the bottom end of the sleeve automatically registers with the sample inlet hole, the sample tube can be maintained afloat by supplying low-pressure air from the body of the NMR spectrometer through the sample inlet hole in the same way as in the case of the prior art automatic sample exchange device. The sample tube is introduced into the body of the apparatus by controlling the supply of the air from the body of the apparatus.

Upon completion of the measurement of the sample, air is again supplied from the body of the analytical instrument. The sample tube is passed through the sleeve and made afloat at a given height exceeding the fringe portion of the fixed plate. Under this condition, if the movable plate is again moved along the fringe portion of the fixed plate, the fringe portion of the fixed plate gradually protrudes into the sleeve. At the same time, the bottom end of the sleeve comes out of registry with the sample inlet hole, thus gradually reducing the area through which air flows. This reduces the flow rate at which air is supplied into the sleeve. Consequently, the floating force at which the sample tube is made afloat weakens. The result is that the sample tube moves down. At this time, since the fringe portion of the fixed plate protrudes considerably into the sleeve. The sample tube is again held by the protruding fringe portion (i.e., the chuck is activated). The movable plate is further moved. The bottom end of the sleeve is completely disengaged from the sample inlet hole. The supply of air is completely stopped. In this manner, with the novel automatic sample exchange device, conveyance and gripping of a sample tube can be performed only with a single mechanism simply by moving the movable plate.

Other objects and features of the invention will appear in the course of the description thereof, which follows.

DETAILED DESCRIPTION OF THE INVENTION

Figure 1:
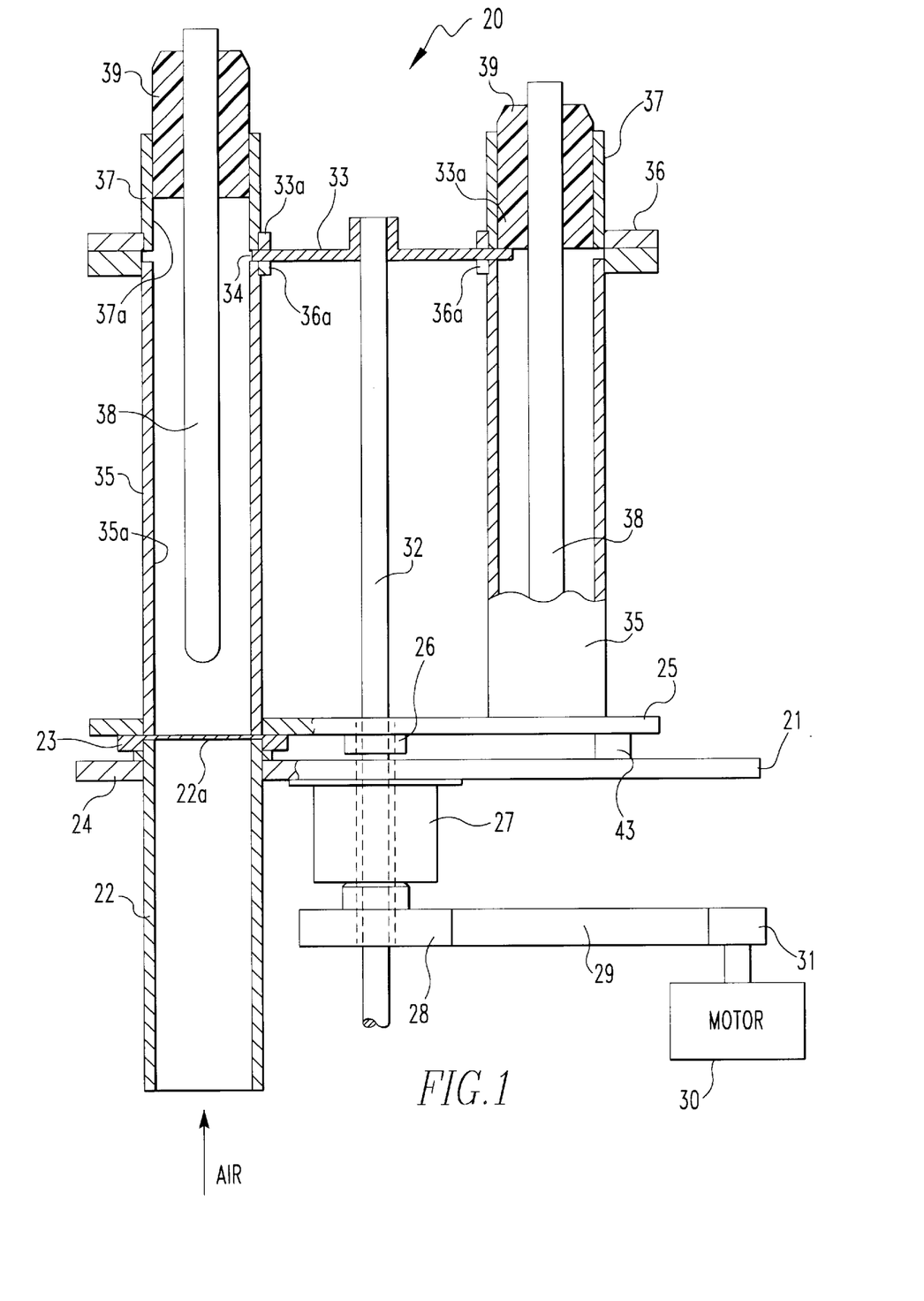
FIG. 1 is a front elevation partly in cross section of an automatic sample exchange device in accordance with the invention.
Figure 2:
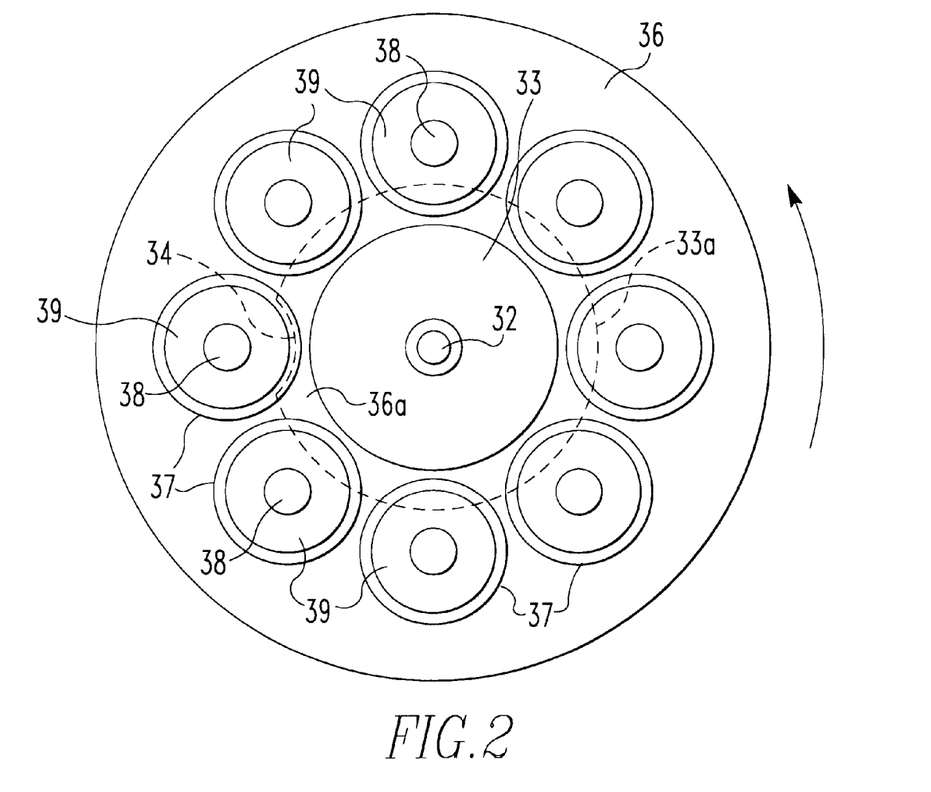
FIG. 2 is a plan view of the automatic sample exchange device shown in FIG. 1.

Referring to FIGS. 1 and 2, there is shown an automatic sample exchange device embodying the concept of the present invention. FIG. 1 is a front elevation partly in cross section of the sample exchange device. FIG. 2 is a plan view of the sample exchange device. This automatic sample exchange device, generally indicated by reference numeral 20, has a base plate 21 to which a sample inlet tube 22 having a sample inlet hole 22a for introducing a sample into the body of an NMR spectrometer is mounted. The sample inlet hole 22a is slightly higher than the base plate 21. A plane bearing 23 of a low frictional coefficient is fitted over an upper end portion of the sample inlet tube 22 so as to be movable up and down. An O ring 24 is interposed between the plane bearing 23 and the base plate 21. The top surface of the plane bearing 23 is located over the top end of the sample inlet tube 22.

A turntable 25 is slidable on the plane bearing 23, and has a cylindrical rotating shaft 26. This shaft 26 extends through the base plate 21 and is connected to the output of a bearing 27, which in turn is fixedly mounted to the bottom surface of the base plate 21. Therefore, the turntable 25 is able to rotate relative to the base plate 21.

When the rotating shaft 26 of the turntable 25 is connected to the output of the bearing 27, the bottom surface of the turntable 25 bears against stoppers 43 mounted on the base plate 21, and lightly pushes the plane bearing 23 downwardly. Therefore, the O ring 24 is slightly deformed by the plane bearing 23. The resulting repulsive force of the O ring 24 is applied to the whole bottom surface of the turntable 25 via the plane bearing 23. The result is that the bottom surface of the turntable 25 and the top surface of the plane bearing 23 are sealed together. Instead of the O ring 24, other resilient body may be used.

A pulley 28 is mounted to the input side of the cylindrical rotating shaft of the bearing 27. This pulley 28 is connected via a gear belt 29 to a pulley 31, which is mounted to the rotating shaft of an ultrasonic motor 30.

Figure 3:
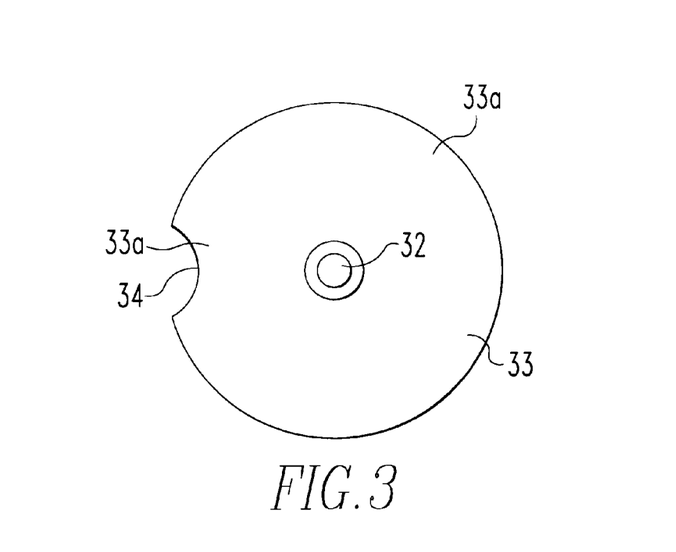
FIG. 3 is a plan view of a disk plate used in the automatic sample exchange device shown in FIG. 1.

A vertically extending shaft 32 is loosely inserted in the rotating shaft 26 of the turntable 25 and in the input-side rotating shaft of the bearing 27. This shaft 32 is mounted to a support base (not shown) of the automatic sample exchange device 20. A circular disk plate 33 is secured on the top end of the shaft 32. As shown in FIG. 3, a single semicircular recess 34 is formed in a fringe portion of the disk plate 33. The diameter of the semicircular recess 34 is equal to or slightly greater than the inside diameter of the sample inlet tube 22. The recess 34 is located immediately above the sample inlet hole 22a in the sample inlet tube 22 and formed coaxially with the sample inlet hole 22a. It is not always necessary that the recess 34 be semicircular in shape; the recess 34 may also assume an arc-shaped form.

Eight lower sleeves 35 having the same inside diameter as that of the sample inlet tube 22 are circumferentially regularly spaced from each other on the turntable 25. The turntable 25 is provided with holes extending through the turntable. The lower sleeves 35 have lower end portions fitted in the holes in the turntable 25. The 8 lower sleeves 35 are so arranged that when the turntable 25 rotates and any one of the 8 lower sleeves 35 is located opposite to the sample inlet tube 22, a hole 35a in this lower sleeve 35 registers with the sample inlet hole 22a in the sample inlet tube 22. An annular plate 36 is made up of two plates laminated on top of each other, and formed with holes extending through the plate 36. The lower sleeves 35 have upper end portions fitted in the holes extending through the annular plate 36. Eight sleeves 37 have lower end portions fitted in the 8 holes, respectively, extending through the annular plate 36.

The disk plate 33 has a fringe portion held between the upper and lower plates of the annular plate 36 at an inner fringe portion 36a of the annular plate 36. The inner fringe portion 36a is slidable relative to the outer fringe portion 33a of the disk plate 33. When the turntable 25 rotates, the 8 upper sleeves 37, the 8 lower sleeves 35, and the annular plate 36 rotate integrally. The surface of the outer fringe portion 33a of the disk plate 33 is processed to reduce the friction in order that the sliding resistance produced during rotation of the annular plate 36 and the sliding resistance produced during rotation of the sample rotor 39 as described later be decreased. The disk plate 33 itself may be made of a low-friction material.

In the present automatic sample exchange device 20, the relative positional relations of the outer fringe portion 33a to the upper and lower sleeves 37, 35 are set as follows. When the holes 37a and 35a in the upper and lower sleeves 37 and 35, respectively, register with the arc-shaped recess 34 in the disk plate 33, the outer fringe portion 33a of the disk plate 33 defining the recess 34 does not protrude into the inner hole 37a or 35a and is in a retracted state. That is, the outer fringe portion 33a of the disk plate 33 is sandwiched between the upper sleeve 37 and the lower sleeve 35 at the left of FIG. 1. In any other position, the outer fringe portion 33a of the disk plate 33 protrudes into the inner holes 37a and 35a. That is, the outer fringe portion 33a of the disk plate 33 is interposed between the upper sleeve 37 and the lower sleeve 35 at the right of FIG. 1.

In the operation of the automatic sample exchange device 20 built as described above, when the holes 37a and 35a in the upper and lower sleeves 37 and 35, respectively, do not register with the arc-shaped recess 34 in the disk plate 33, if conventional sample tubes 38 are inserted from above into the upper and lower sleeves 37 and 35, respectively, the bottom surface of the sample rotor 39 comes into engagement with the outer fringe portion 33a of the disk plate 33 protruding into the holes 37a and 35a. As a result, the sample tubes 38 are arrayed and held on the outer fringe portion 33a of the disk plate 33 in the upper and lower sleeves 37 and 35, respectively. That is, the chuck is activated.

Under this condition, the ultrasonic motor 30 is driven to convey the sample tubes 38 into the sample inlet hole 22a, for introducing the tubes into the body of the NMR spectrometer. The motor 30 rotates the turntable 25 in a counterclockwise direction, for example, as viewed in FIG. 2. Low-pressure air is supplied through the sample inlet tube 22 and directed upward simultaneously with, before, or after the rotation of the turntable 25. The rotation of the turntable 25 rotates the sleeves 35 and 37 together with the annular plate 36. The sample tubes 38 inserted in the sleeves 35 and 37 are rotated and conveyed. The sample tubes 38 are transported while the sample rotor 39 is guided by the upper sleeves 37. At the same time, the bottom surface of the sample rotor 39 slides on the outer fringe portion 33a of the disk plate 33.

Figure 4A:
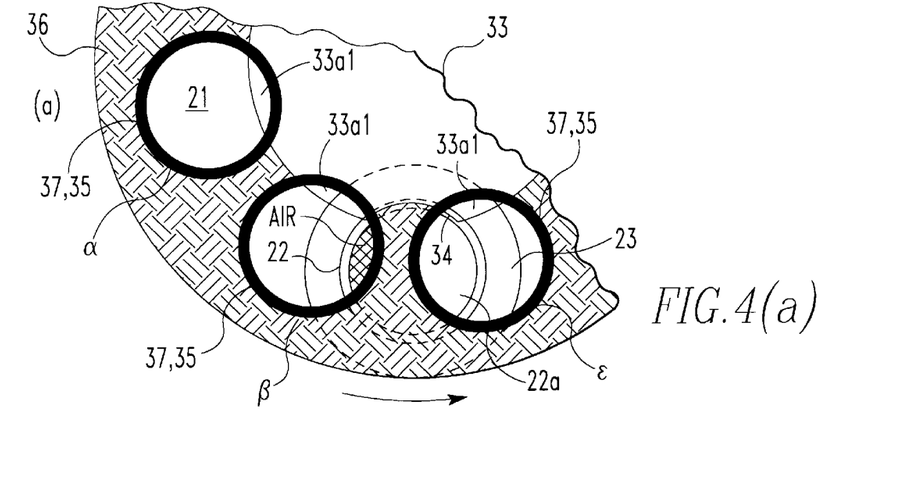
FIGS. 4(a)–4(c) are fragmentary views of the automatic sample exchange device shown in FIG. 1, illustrating the operation.

Then, as shown in FIG. 4(a), each sample tube 38 is inserted in the upper and lower sleeves 37 and 35, respectively. The hole 35a in the lower sleeve 35 does not register with the sample inlet sole 22a at all. The sample rotor 39 engages an engaging portion $33a_1$ of the outer fringe portion 33a of the disk plate 33. At a position α, the rotor 39 engages the outer fringe portion 33a to the greatest extent. As the rotor 39 rotates from this position α in a counterclockwise direction, the sample inlet hole 22a is gradually approached. A part of the hole 35a in the lower sleeve 35 registers with a part of the sample inlet hole 22a. A position β is reached where the rotor 39 registers with the engaging portion $33a_1$ of the outer fringe portion 33a of the disk plate 33 to somewhat lesser extent. When the hole 35a in the lower sleeve 35 goes inwardly across the outer circumference of the plane bearing 23, the circumference of the inner hole 35a and the circumference of the sample inlet hole 22a are sealed together because of the pressure applied between the top surface of the plane bearing 23 and the plane portions between the successive lower sleeves 35 on the bottom surface of the turntable 25.

At the position β of the upper and lower sleeves 37 and 35, respectively, air supplied through the sample inlet tube 22 and through the overlapping portions (hatched portions in FIG. 4 (a)) of the holes in the lower sleeves 35 and the sample inlet hole 22a flows into the upper and lower sleeves 35 and 37, respectively, and begins to act on the bottom surface of the sample rotor 39. Although the bottom surface of the turntable 25 and the top surface of the plane bearing 23 are sealed together, a gap exists between the outer surface of the plane bearing 23 and the hole 35a in the lower sleeve 35. The air leaks from this gap. Eventually, only a small amount of air acts on the sample rotor 39.

Figure 4B:
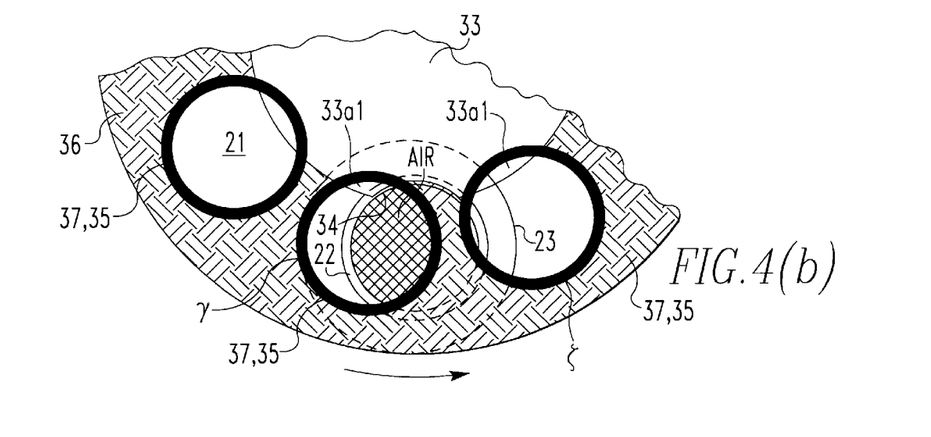

If the annular plate 36 rotates in the same direction, the hole 35a in the lower sleeve 35 overlaps the sample inlet hole 22a to a considerable extent, as shown in FIG. 4(b). The sample rotor 39 engages the engaging portion $33a_1$ of the outer fringe portion 33a of the disk plate 33 to somewhat lesser extent in a position γ.

In the position γ of the upper and lower sleeves 37 and 35, respectively, the sample rotor 39 is still in engagement with the engaging portion $33a_1$ of the outer fringe portion. An increased amount of air flows into the upper and lower sleeves 35 and 37, respectively, through the sample inlet tube 22. As a result, the air exerts a greater force on the bottom surface of the sample rotor 39.

Figure 4C:
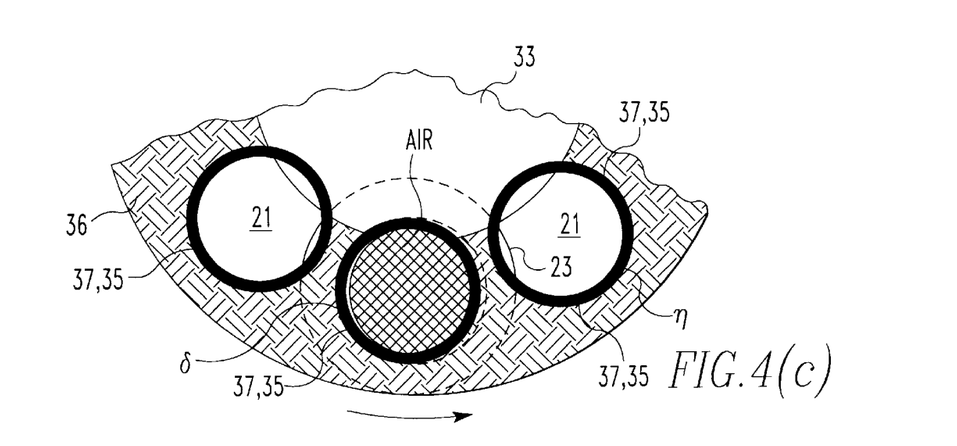

If the annular plate 36 is rotated further in the same direction, the hole 35a in the lower sleeve 35 nearly fully overlaps the sample inlet hole 22a at a position δ of the upper and lower sleeves 37 and 35, respectively, as shown in FIG. 4(c). Then, the hole 35a in the lower sleeve 35 completely registers with the sample inlet hole 22a, and the ultrasonic motor 30 ceases to operate. Accordingly, the turntable 25, the annular plate 36, and the sleeves 35, 37 come to a stop. Where the inner hole 35a registers with the sample inlet hole 22a, the outer fringe portion 33a of the disk plate 33 is fully withdrawn from the holes 37a, 35a of the sleeves 37 and 35. The engaging portion $33a_1$ has disappeared totally. Therefore, the sample rotor 39 is free to move. The sample holder 38 is no longer retained by the outer fringe portion 33a of the disk plate 33. However, air from the sample inlet tube 22 does not flow out but flows into the sleeves 35 and 37. The low-pressure air directed upward holds the sample tubes 38 afloat. The sample tubes 38 are carried into the location immediately above the sample inlet hole 22a. Hence, the sample tubes 38 can be immediately introduced into the body of the NMR spectrometer. Subsequently, the sample tubes 14 are moved downward via the sample inlet tube 22 toward the body of the NMR spectrometer by controlling the supply of the low-pressure air in the same way as in the foregoing.

When the body of the NMR spectrometer completes a measurement of the sample in the sample tube 14, air is again supplied to move the sample tube 14 upward until the bottom surface of the sample rotor 39 is higher than the disk plate 33. The sample tube 14 is held afloat at a given height above the disk plate 33. Under this condition, the ultrasonic motor 30 is driven to rotate the turntable 25 and the annular plate 36 in the same direction. As shown in FIG. 4(a), the upper and lower sleeves 37 and 35 assume a position $\in$ in which the hole 35a in the lower sleeve 35 overlaps the sample inlet hole 22a to a lesser extent. At this time, the adjacent next upper and lower sleeves 37 and 35 take the aforementioned position β. At this position β, the amount of air flowing into the upper and lower sleeves 37 and 35, respectively, decreases. The floating force that the sample tube 38 and the sample rotor 39 undergo from the air decreases, so that the sample tube 38 and the sample rotor 39 are lowered. At this time, however, the outer fringe portion 33a of the disk plate 33 protrudes into the holes 37a and 35a in the sleeves 37 and 35, respectively, thus forming the engaging portion $33a_1$. The bottom surface of the sample rotor 39 engages the engaging portion $33a_1$. The sample tube 38 is held by the outer fringe portion 33a of the disk plate 33. That is, the chuck is activated.

The annular plate 36 is rotated further in the same direction. The upper and lower sleeves 37 and 35 assume a position ζ where the hole 35a in the lower sleeve 35 hardly overlaps the sample inlet hole 22a, as shown in FIG. 4(b). Then, the sleeves take a position η where the hole 35a in the lower sleeve 35 is fully disconnected from the sample inlet hole 22a, as shown in FIG. 4(c). At this time, the next adjacent upper and lower sleeves 37 and 35 assume the above-described position δ. When the hole 35a in the next lower sleeve 35 fully registers with the sample inlet hole 22a, the ultrasonic motor 30 is stopped. The turntable 25, the sleeves 35, 37, and the annular plate 36 come to a stop.

The operations described above are repeated. When all measurements are completed, the sample tubes 38 are pulled away from the upper sleeves 37. New sample tubes 38 holding new samples are inserted from above the upper sleeves 37. The sample tubes 38 are held in the disk plate 33 in the same manner as the foregoing method. That is, the chuck is activated.

In this way, in the present automatic sample exchange device 20, conveyance and gripping of the sample tube can be simultaneously and automatically done simply by rotating the annular plate 36. That is, the automatic sample exchange device 20 combines an automatic sample tube conveyance mechanism and a sample tube-gripping mechanism in one mechanism. It is only necessary to control this single mechanism. Therefore, only simple control unit and simple control software are needed. In addition, it is only necessary to provide the disk plate 33, the annular plate 36, and the turntable 25. Hence, the structure can be made simple. Consequently, the present automatic sample exchange device 20 can be easily and economically fabricated.

The automatic sample exchange device 20 uses the ultrasonic motor 30 that operates reliably without being affected by a strong field leaking from the NMR spectrometer. Therefore, it is not necessary to use a cylinder unlike in the prior art technique. In consequence, the sample can be moved any desired distance. Also, the distance can be set easily. Thus, more sample tubes 38 can be used than conventional.

Moreover, the device can flexibly cope with the varying amount of the sample by appropriately setting the diameter of the circumference along which the sample tubes 38 are arranged. This offers a higher degree of flexibility. Also, the sample tube conveyance mechanism and the sample tube-gripping mechanism can be combined in one mechanism even if the number of the sample tubes 38 increases. Therefore, the number of the components can be reduced. The cost can be reduced further.

Furthermore, it is only necessary for the present sample-gripping mechanism to arrange the sleeves 35 and 37 having an inside diameter slightly greater than the diameter of the sample rotor 39 holding the sample tubes 38. This dispenses with the slide plate 7 sliding vertical to sample tubes 38. Therefore, the gripping mechanism does not expand. The installation space can be effectively utilized. This greatly contributes to miniaturization of the device.

The surface of the plane bearing 23 is contacted with the bottom surface of the turntable 25 under a given pressure. Therefore, the plane bearing 23 provides a large surface area sealed to the turntable 25. This assures the sealing. It is possible to flexibly cope with various kinds of automatic sample exchange devices by appropriately setting the size of the plane bearing 23 according to the conditions under which the used automatic sample exchange device 20 is designed.

Further, it is only necessary to adjust this pressure only in the z-direction vertical to the direction of movement of each lower sleeve 35. This can lead to a simpler structure. Thus, the pressure can be easily made uniform among the lower sleeves 35. The torque necessary for operation can be rendered constant.

Figure 5:
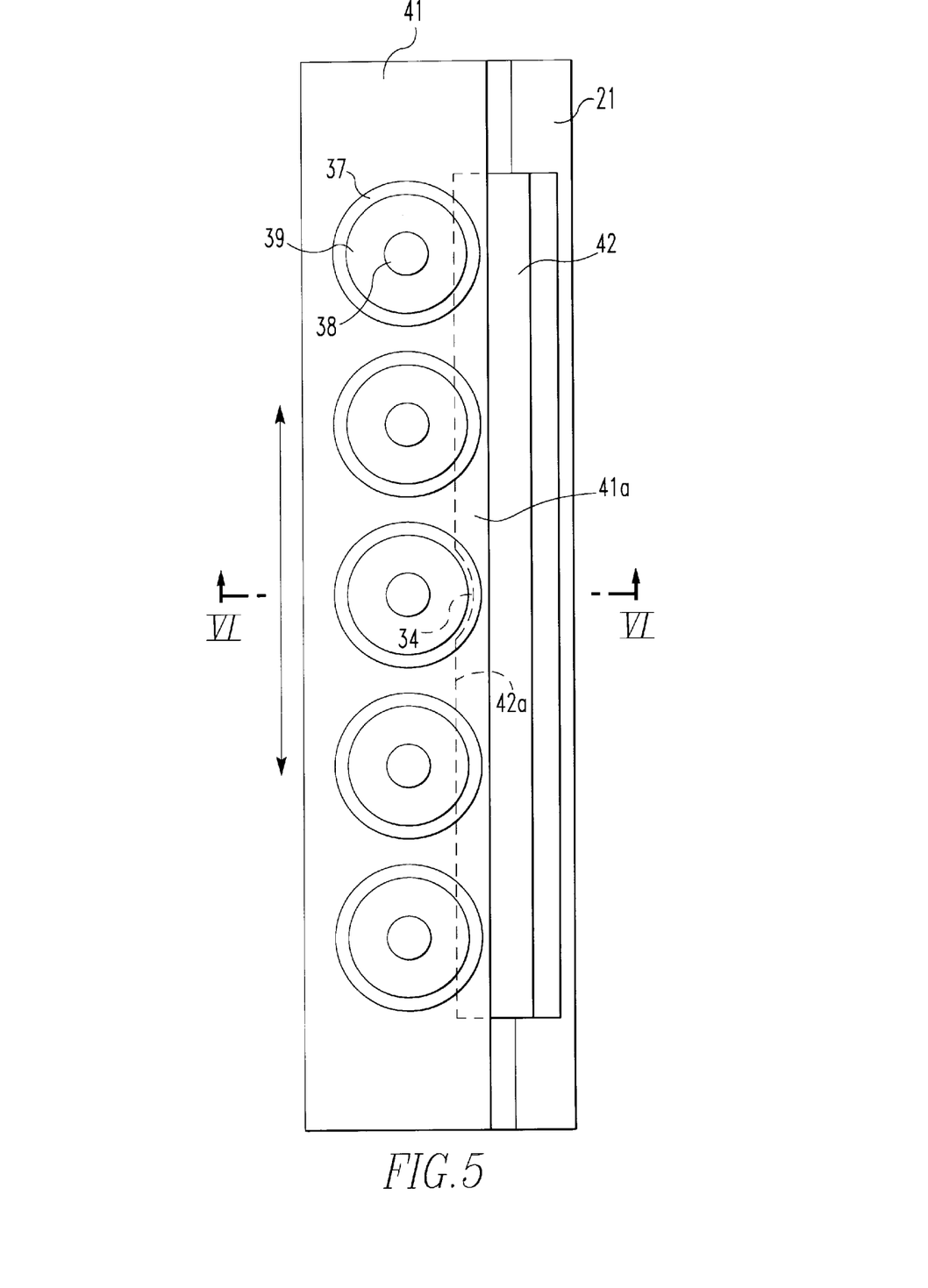
FIG. 5 is a plan view of another automatic sample exchange device in accordance with the invention.
Figure 6:
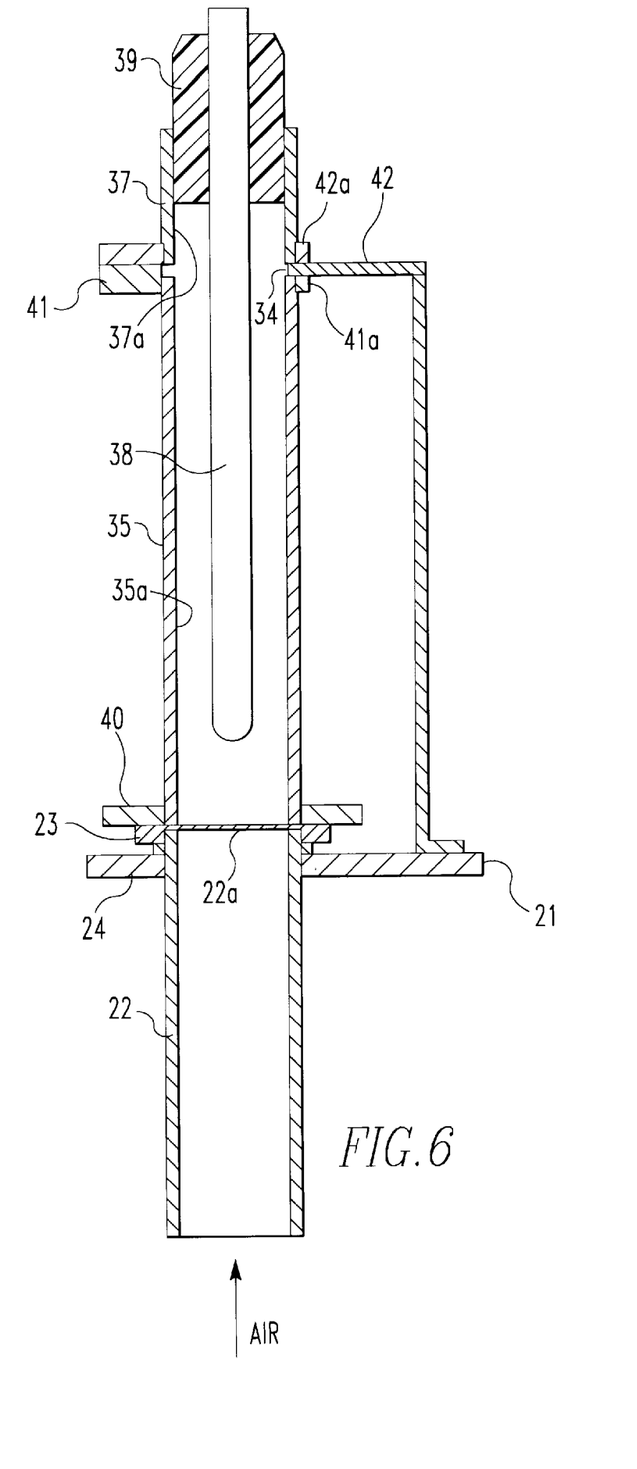
FIG. 6 is a cross-sectional view taken on line VI—VI of FIG. 5.

Referring next to FIGS. 5 and 6, there is shown another automatic sample exchange device in accordance with the present invention. FIG. 6 is a cross-sectional view taken on line VI—VI of FIG. 5. This sample exchange device is similar to the automatic sample exchange device 20 described already in connection with FIGS. 1 and 2.

In the embodiment described in connection with FIGS. 1 and 2, the disk plate 33 is circularly shaped. The sleeves 35 and 37 are circumferentially arranged and held on the turntable 25 and on the annular plate 36. The sample tubes 38 are conveyed by rotating the sleeves 35 and 37. In the present automatic sample exchange device 20 shown in FIGS. 5 and 6, sleeves 35 and 37 are arranged linearly in the longitudinal direction of both a table 40 moving straight and a first rectangular plate 41, and are held by these table 40 and plate 41.

A second rectangular plate 42 is fixedly mounted to the base plate 21. A semicircular recess 34 similar to the above-described semicircular recess 34 is formed at one side fringe portion 42a of the second rectangular plate 42 and just above the sample inlet hole 22a.

The first rectangular plate 41 is made up of two plates laminated on top of each other in the same way as the annular plate 36. One side fringe portion 42a of the second rectangular plate 42 is slidably held between the two plates forming the first rectangular plate 41 at its one side end 41a. The table 40 moving straight is slidable on the plane bearing 23 and makes a linear movement on the bearing 23. Rotating driving force from the ultrasonic motor 30 may be converted into a linear driving force via an endless belt (not shown) and transmitted to the table 40 moving straight. Alternatively, the rotating driving force from the ultrasonic motor 30 may be transmitted to the linearly moving table 40 via a rack and a pinion, to move the table 40 linearly. Of course, the table 40 may be moved straight by any other method.

The present automatic sample exchange device 20 constructed in this way is similar in operation to the foregoing embodiment except that the sleeves 35 and 37, i.e., the sample tubes 38, make straight movements. This automatic sample exchange device 20 yields the same advantages as the above-described embodiment.

It is to be noted that the automatic sample exchange device in accordance with the present invention is not limited to use in NMR spectrometers but rather can be applied to any analytical instrument as long as it automatically exchanges samples.

As can be understood from the description provided thus far, an automatic sample exchange device in accordance with the present invention has a single mechanism that acts as a mechanism for conveying sample tubes and also as a chuck mechanism for gripping the sample tubes. Conveyance and gripping of the sample tubes can be simultaneously and automatically done simply by moving a conveyance plate of the single mechanism described above. Also, only simple control unit and simple control software are necessary because only the single mechanism is required to be controlled. Furthermore, the structure is simple because it is necessary to provide only fixed and movable plates. Therefore, the automatic sample exchange device can be easily manufactured at low cost.

An ultrasonic motor that is not affected by strong leaking magnetic fields is used. Hence, this motor operates reliably. Therefore, the prior art cylinder is dispensed with. Accordingly, each sample can be moved any arbitrary distance. Also, this distance can be set easily. Consequently, more sample tubes can be used than heretofore.

Moreover, the device can flexibly cope with the varying amount of sample by means of the same mechanism by appropriately setting the size of a movable plate to which sleeves holding sample tubes are attached. This offers a higher degree of flexibility. Further, only one mechanism is necessary to convey and grip sample tubes even if the number of the sample tubes increases. In consequence, the number of the components can be reduced. The cost can be curtailed further. Additionally, the sample tube-gripping mechanism of the automatic sample exchange device is not expanded. Effective use of the installation space can be made. The device can be miniaturized effectively.

What is claimed is:

1. An automatic sample exchange device for delivering sample tubes to a sample inlet hole comprising:

a fixed plate being a circular disk plate having a center having a fringe portion provided with a recess located just above said sample inlet hole;

a movable plate being an annular plate mounted coaxially with said disk plate, said annular plate being capable of rotating about the center of said disk plate and capable of moving along said fringe portion of said fixed plate; and a plurality of sleeves arranged circumferentially of and attached to said annular plate into which sample tubes can be inserted, said sleeves being mounted in said movable plate, said sleeves being capable of moving with said movable plate such that the lower ends of the sleeves are capable of being located in registry with said sample inlet hole, said automatic sample exchange device being designed so that when any one of said sleeves registers with said recess in said fixed plate, said fringe portion of said fixed plate does not protrude into said sleeve and that when sleeves do not register with said recess, said fringe portion protrudes into the sleeves to thereby hold sample tubes from dropping.

2. The automatic sample exchange device according to claim 1, wherein said annular plate is moved by a rotating force generated by an ultrasonic motor.

3. The automatic sample exchange device of claim 2, wherein said sample inlet hole is formed in a nuclear magnetic resonance spectrometer.

4. The automatic sample exchange device according to claim 1, wherein said movable plate slides on a surface of said fringe portion of said fixed plate, and wherein at least the surface of said fringe portion of said fixed plate is processed to exhibit low friction or said fixed plate is made of a low-friction material.

5. The automatic sample exchange device of claim 4, wherein said sample inlet hole is formed in a nuclear magnetic resonance spectrometer.

6. The automatic sample exchange device of any one of claims 1, 4 or 5, wherein when a bottom end of any one of said sleeves is located opposite to said sample inlet hole, a gas under pressure is blown upward from said sample inlet hole to maintain the sample tube afloat, and then flow rate of said gas under pressure is suppressed to lower said sample tube into a measuring portion of an analytical instrument.

7. The automatic sample exchange device of claim 6, wherein said sample inlet hole is formed in a nuclear magnetic resonance spectrometer.

* * * * *

UNITED STATES PATENT AND TRADEMARK OFFICE
CERTIFICATE OF CORRECTION

PATENT NO. : 5,952,831
DATED : September 14, 1999
INVENTOR(S) : Yoshiaki Yamakoshi et al.

It is certified that error appears in the above-identified patent and that said Letters Patent is hereby corrected as shown below:

Title Page, insert:
    --[30] Foreign Application Priority Data
       Aug. 14, 1996   [JP]   Japan..........8-214598--.

Column 2 Line 56 "as been" should read --has been--.

Column 6 Line 15 "sole 22a" should read --hole 22a--.

Signed and Sealed this

Eighteenth Day of April, 2000

Attest:

Q. TODD DICKINSON

*Attesting Officer*   *Director of Patents and Trademarks*